United States Patent
Abbaspour et al.

(10) Patent No.: US 8,020,129 B2
(45) Date of Patent: Sep. 13, 2011

(54) MULTIPLE VOLTAGE THRESHOLD TIMING ANALYSIS FOR A DIGITAL INTEGRATED CIRCUIT

(75) Inventors: Soroush Abbaspour, Fishkill, NY (US); Peter Feldmann, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 561 days.

(21) Appl. No.: 12/021,723

(22) Filed: Jan. 29, 2008

(65) Prior Publication Data
US 2009/0193373 A1 Jul. 30, 2009

(51) Int. Cl.
*G06F 17/50* (2006.01)
(52) U.S. Cl. .......... 716/113; 716/136; 716/108; 703/16
(58) Field of Classification Search ......... 716/5; 703/16
See application file for complete search history.

(56) References Cited

U.S. PATENT DOCUMENTS

| | | | |
|---|---|---|---|
| 6,353,917 B1* | 3/2002 | Muddu et al. ............ | 716/6 |
| 6,496,960 B1* | 12/2002 | Kashyap et al. ............ | 716/4 |
| 6,519,748 B2* | 2/2003 | Sakamoto ............ | 716/6 |
| 6,789,237 B1* | 9/2004 | Ismail ............ | 716/4 |
| 7,142,991 B2 | 11/2006 | Hathaway et al. | |
| 7,213,218 B2 | 5/2007 | Miura et al. | |
| 7,272,807 B2* | 9/2007 | Ding et al. ............ | 716/6 |
| 7,310,792 B2 | 12/2007 | Verghese et al. | |
| 7,480,875 B2* | 1/2009 | Satoh et al. ............ | 716/132 |
| 7,594,209 B2* | 9/2009 | Abbaspour et al. ............ | 716/108 |
| 7,761,275 B2* | 7/2010 | Chopra et al. ............ | 703/14 |
| 7,818,157 B2* | 10/2010 | Schultz ............ | 703/14 |
| 7,890,915 B2* | 2/2011 | Celik et al. ............ | 716/113 |
| 2002/0016950 A1* | 2/2002 | Sakamoto ............ | 716/6 |
| 2003/0115563 A1* | 6/2003 | Chen ............ | 716/5 |
| 2003/0208346 A1* | 11/2003 | Huang ............ | 703/14 |
| 2004/0243952 A1* | 12/2004 | Croix ............ | 716/4 |
| 2005/0278671 A1 | 12/2005 | Verghese et al. | |
| 2006/0010406 A1* | 1/2006 | Lee et al. ............ | 716/5 |
| 2006/0190881 A1* | 8/2006 | Su et al. ............ | 716/6 |
| 2006/0200784 A1* | 9/2006 | Ding et al. ............ | 716/6 |
| 2007/0143719 A1* | 6/2007 | Chopra et al. ............ | 716/4 |
| 2008/0270960 A1* | 10/2008 | Abbaspour et al. ............ | 716/6 |

OTHER PUBLICATIONS

Synopsys, Predictable Success, "Composite Current Source (CCS)," retrieved Jan. 2008 from URL:http://www.synopsys.com/products/solutions/galaxy/ccs/ccs_faq.html, 2 pages.

(Continued)

*Primary Examiner* — Phallaka Kik
(74) *Attorney, Agent, or Firm* — Preston Young; Hoffman Warnick LLC (57) ABSTRACT

An approach for performing multiple voltage threshold timing analysis for a digital integrated circuit is described. In one embodiment, there is a multiple voltage threshold timing analysis tool for performing a multiple voltage threshold timing analysis of a digital integrated circuit having at least one logic gate loaded by an interconnect circuit. In this embodiment, a characterization data retrieving component is configured to obtain characterization data describing driving behavior of the at least one logic gate. An interconnect circuit model retrieving component is configured to obtain a model of the interconnect circuit. A multiple voltage threshold timing analysis component is configured to derive a sequence of crossing times for the driving point voltage waveform to advance between successive voltage thresholds. The multiple voltage threshold timing analysis component also generates a voltage waveform from the derived sequence of crossing times.

15 Claims, 4 Drawing Sheets

OTHER PUBLICATIONS

Cadence, "Effective Current Source Model (ECSM)," retrieved Jan. 2008 from URL:http://www.cadence.com/partners/languages/ecsm.aspx, 3 pages, 1997.

Chopra et al., "Current Source Drive Model Synthesis and Worst-case Alignment for Accurate Timing and Noise Analysis," Feb. 2006, 1 page abstract, ACM/IEEE International Workshop on Timing Issues (TAU 2006), retrieved from: http://www.tauworkshop.com/papers06/52.html.

Brent, "An Algorithm with Guaranteed Convergence for Finding a Zero of a Function," Mar. 1971, pp. 422-425, vol. 14, No. 4, The Computer Journal.

Croix et al., "Blade and Razor: Cell and Interconnect Delay Analysis Using Current-Based Models," Jun. 2003, pp. 386-389, proceeding of ACM/IEEE Design Automation Conference, Anaheim, CA.

Elmore, "The Transient Response of Damped Linear Networks with Particular Regard to Wideband Amplifiers," Jan. 1948, pp. 55-63, Journal of Applied Physics.

Hashimoto, et al., "Equivalent Waveform Propagation for Static Timing Analysis," Nov. 2003, pp. 169-175, Proceeding of IEEE International Conference on Computer Aided Design, San Jose, CA.

Keller et al., "A robust cell-level crosstalk delay change analysis," 2004, pp. 147-154, Proceeding of IEEE International Conference on Computer Aided Design.

Macys et al., "A New Algorithm for Computing the "Effective Capacitance" in Deep Sub-micron Circuits," 1998, pp. 313-316, Proceeding of the IEEE Custom Integrated Circuits Conference.

Qian et al., "Modeling the "Effective Capacitance" for the RC Interconnect of CMOS Gate," Dec. 1994, pp. 1526-1535, vol. 13, No. 12, IEEE Transactions on Computer-Aided Design of Integrated Circuits and Systems.

Abbaspour et al., "Calculating the Effective Capacitance for the RC Interconnect in VDSM Technologies," 2003, pp. 43-48, Proceeding of Asia and South Pacific Design Automation Conference.

* cited by examiner

MULTIPLE VOLTAGE THRESHOLD TIMING ANALYSIS FOR A DIGITAL INTEGRATED CIRCUIT

BACKGROUND

This invention relates generally to design automation of Very Large Integrated Circuits (VLSI), and more particularly to multiple voltage threshold timing analysis of digital integrated circuits.

Timing and noise analysis are key verification steps in every design flow for ultra deep sub-micron VLSI circuits. In these applications a pre-characterized high level model of a cell such as a logic gate loaded by an interconnect circuit is analyzed in order to determine delays through the various logic stages. Traditionally logic gates were modeled by ideal delays and their driving properties by simple Thevenin voltage sources. The signals were represented as idealized ramp shaped voltage waveforms. This approach has proven to be insufficiently accurate for timing and noise analysis purposes for chips implemented in the newest technologies. The main source of inaccuracy is the fact that the pre-characterization process can be practically performed only in terms of purely capacitive loads while the reality of the modern VLSI interconnect drifts further and further away from this assumption. On chip wires are highly resistive and even the inductive effects become significant at high frequencies. As a consequence the timing analysis algorithm has the challenge to adapt the pre-characterization data collected with just pure capacitive loading to the reality of RLC loads.

The VLSI industry addressed this challenge mainly by introducing the concept of an effective capacitance that would capture the effect of a resistive-capacitive load. The effective capacitance is a function of two parameters: (1) output voltage waveform of the driving gate and (2) the characteristics of the load, more specifically the driving point admittance of the interconnect. Two gates are considered to be equivalent in terms of calculating effective capacitance if they produce the same output waveform when driving the same load.

There are several approaches that can be used to calculate the effective capacitance. One effective capacitance calculation technique uses a two-piece output waveform that approximates the output waveform of a complementary metal-oxide-semiconductor (CMOS) gate. This technique calculates the effective capacitance by equating the charges at the gate output when using the driving-point admittance of the load and using a single effective capacitance as the load. Average charges for both load models are equated until the gate output voltage reaches the 50% threshold. Another approach uses a table of circuit simulation results and a pair of two-dimensional delay tables to calculate a value for the effective capacitance. In this approach, the effective capacitance is a function of the total capacitance in the π-model ($C_{total}$), the gate output slew rate, and the Elmore delay of the load. The π-model load is approximated with an effective capacitance such that the output voltage waveforms of the driving cell passes through some critical voltages (e.g., 0.2Vdd and 0.8Vdd) at the same instances in time. In another approach, the effective capacitance is calculated to approximately match both 50% propagation delay and the output transition time. All these approaches which produce just a single number, the effective capacitance, are bound to become inaccurate for the increasingly complicated gate and interconnect models in advanced VLSI technologies.

As a consequence, the recent trend in the industry is to adopt electrically-based driver modeling (e.g., Controlled Current Source Models) within timing and noise analysis engines. Examples are Cadence and Magma's effective current source model (ECSM) and Synopsys' composite current source model (CCS). The ECSM model, for example, represents drivers as controlled current sources dependent on the driving point voltage and a so-called dynamic capacitance: $I=f_I(V,C)$. The characterization process for this model is repeated simulations over ranges of ideal voltage ramp input excitations and pure capacitive loads. The results of these simulations are tabulated as driving point transition times as a function of voltage thresholds, and capacitive loads, $T=f_T(V,C)$ data. The controlled-current source model $I=f_I(V,C)$ model is obtained by fitting to the $T=f_T(V,C)$ data. CCS uses a similar characterization style; the main difference is that the characterization data is stored as current (rather than voltage) as a function of time and capacitive load. The two raw characterization data sets are essentially equivalent and can be mapped from one to another.

Both ECSM and CCS modeling imply the transformation of raw modeling data, e.g. $T=f_T(V,C)$ into a nonlinear controlled current source device, e.g. $I=f_I(V,C)$. This intermediate transformation incurs additional approximations and loss of accuracy. Moreover, these models require a relatively high degree of continuity and smoothness for accurate, reliable, and efficient timing and/or noise analysis.

SUMMARY

In one embodiment, there is a method for performing a multiple voltage threshold timing analysis of a digital integrated circuit having at least one logic gate loaded by an interconnect circuit. In this embodiment, the method comprises: obtaining characterization data describing driving behavior of the at least one logic gate, wherein the characterization data tabulates a driving point voltage waveform for the at least one logic gate as a function of slew of an input voltage ramp signal and load capacitance; obtaining a model of the interconnect circuit; deriving a sequence of crossing times for the driving point voltage waveform to advance between successive voltage thresholds from the characterization data of the at least one logic gate and the model of the interconnect circuit; and generating a voltage waveform from the derived sequence of crossing times, wherein the generated voltage waveform is represented by the derived sequence of crossing times and corresponding sequence of voltage thresholds and is indicative of the driving point voltage of the at least one logic gate loaded by the interconnect circuit.

In a second embodiment, there is a computer-readable medium storing computer instructions, which when executed, enables a computer system to perform a multiple voltage threshold timing analysis of a digital integrated circuit having at least one logic gate loaded by an interconnect circuit. In this embodiment, the computer instructions comprises: obtaining characterization data describing driving behavior of the at least one logic gate, wherein the characterization data tabulates a driving point voltage waveform for the at least one logic gate as a function of slew of an input voltage ramp signal and load capacitance; obtaining a model of the interconnect circuit; deriving a sequence of crossing times for the driving point voltage waveform to advance between successive voltage thresholds from the characterization data of the at least one logic gate and the model of the interconnect circuit; and generating a voltage waveform from the derived sequence of crossing times, wherein the generated voltage waveform is represented by the derived sequence of crossing times and corresponding sequence of voltage thresholds and is indicative of the driving point voltage of the at least one logic gate loaded by the interconnect circuit.

In a third embodiment, there is a computer system for performing a multiple voltage threshold timing analysis. The computer system comprises at least one processing unit and memory operably associated with the at least one processing unit. A multiple voltage threshold timing analysis tool storable in memory and executable by the at least one processing unit performs a multiple voltage threshold timing analysis of a digital integrated circuit having at least one logic gate loaded by an interconnect circuit. The multiple voltage threshold timing analysis tool comprises a characterization data retrieving component configured to obtain characterization data describing driving behavior of the at least one logic gate. The characterization data tabulates a driving point voltage waveform for the at least one logic gate as a function of slew of an input voltage ramp signal and load capacitance. An interconnect circuit model retrieving component is configured to obtain a model of the interconnect circuit. A multiple voltage threshold timing analysis component is configured to derive a sequence of crossing times for the driving point voltage waveform to advance between successive voltage thresholds from the characterization data of the at least one logic gate and the model of the interconnect circuit. The multiple voltage threshold timing analysis component also generates a voltage waveform from the derived sequence of crossing times. The generated voltage waveform is represented by the derived sequence of crossing times and corresponding sequence of voltage thresholds and is indicative of the driving point voltage of the at least one logic gate loaded by the interconnect circuit.

DETAILED DESCRIPTION

Embodiments of this invention address the issues associated with using the ECSM and CCS models by providing a new analytical framework which is stable, efficient, accurate and extensible to a wide array of modeling techniques, including ECSM and CCS, which are emerging industry standards. In particular, embodiments of this invention relate to a multiple voltage threshold timing analysis that utilizes an algorithm for the simulation of a controlled current source driver model in conjunction with a linear interconnect RLC load. The algorithm advances on the voltage axis as opposed to the time axis and requires only the raw $T=f_T(V,C)$-type driver characterization data in its original tabular format. The data transformation step and smoothing procedure involved in creating the intermediate current source model $I=f_I(V,C)$, is eliminated and, as a consequence, the associated computational effort, and loss of accuracy is avoided. This algorithm has similar or superior efficiency to the ones that involve the generation of an explicit controlled current source model.

Most timing analysis methodologies used in practice in both past and present, pre-characterize and store in libraries the driving behavior of logic gates. This behavior is tabulated as functions of an input ramp signal of various transition times and a range of capacitive loads.

The common problem facing all such methodologies is the fact that the true loads driven by the instances of the gate are not purely capacitive. Modern VLSI interconnect is highly resistive and even inductive effects are no longer negligible at high frequencies. As a consequence the timing analysis algorithm has the challenge to adapt the pre-characterization data collected with just pure capacitive loading to the reality of RLC loads.

The traditional techniques abstracted the output waveform of a gate as an ideal voltage ramp, easily described by two parameters: the delay and the slew (i.e., arrival time and transition time of the waveform). Gate characterization consists of tabulating delay and slew of the voltage at the gate output as function of the gate input slew and a capacitive load. For general loads, these techniques use the concept of effective capacitance and iteratively reduce the representation of a complicated RLC load to one single number, $C_{eff}$. The recent controlled-current source models were introduced as a consequence of the fact that in state-of-the-art VLSI technologies such reduction can no longer be made without compromising analysis accuracy.

The recent controlled-current source methods capture more detail of the output behavior. The ECSM method and the technique presented in this invention tabulate a representation of the driving point voltage waveform as function of a load capacitance, and an input signal slew. The CCS method tabulates a representation of the gate output current waveform as function of the same. In all cases the analysis algorithm must adapt to the real load typically represented by an RLC circuit.

Below is the theoretical foundation on how to derive this adaptation process, and in the sequel is a multiple voltage threshold timing analysis algorithm according to one embodiment of the invention which is based on this foundation. Given that the input of the gate is assumed known, (the result of timing analysis performed on the previous logic stage), the gate output is modeled as a nonlinear dynamic system with one state-variable. This state variable is chosen as the gate output voltage, v. With such a model, the gate current is:

$$i = f_d\left(v, \frac{dv}{dt}\right) \tag{1}$$

In fact, the full transistor level equations for a CMOS inverter with known input will result in exactly this form. More complicated gates will have additional states corresponding to charges stored in internal nodes but they may still be approximated (at least in a worst-case sense) by such a model. Equation (1) constitutes a model which does not depend explicitly on the load attached at the gate output. Instead, the output voltage waveform will depend implicitly on the admittance of the load. When the load is a pure capacitance, C, as it happens during gate pre-characterization, the model equation can be rewritten as $$i = f_d\left(v, \frac{i}{C}\right)$$

which can be solved formally to make i explicit $$i = f_{vc}(v,C) \tag{2}$$

Under mild assumptions, Equations (1) and (2) are equivalent, the difference being essentially just a change of variables. The parameter C can be interpreted as a time varying instantaneous equivalent load capacitance $$C(t) = i(t) \bigg/ \frac{dv}{dt}(t)$$

which we denote as dynamic capacitance, $C_d(t)$. Therefore, parametrizing the output current waveform as a function of this instantaneous capacitive load is equivalent to assuming that the gate is described by the one-state nonlinear dynamical system in Equation (1). From a circuit simulation perspective, it is preferable to model gates as dynamical systems, but for historical reasons, the timing community continues to use parametrization in terms of an equivalent capacitance. Therefore, the following will carefully define and adopt $C_d$ for this purpose.

It is interesting to note the connection between this newly defined dynamic capacitance and the effective capacitance used by traditional methods. The effective capacitance for a voltage threshold $V_l$, typically chosen as the mid-point of the full voltage swing, $V_{50}\%$, satisfies by definition the relation $$\int_0^{T_l} i_o(t) dt = C_{e,l} V_l \quad (3)$$

where $T_l$ represents the threshold crossing time. For the case of multiple voltage threshold monitoring (MVTM) analysis this definition introduces a sequence of effective capacitances each corresponding to a different threshold. Therefore, it can be written as:

$$\int_{T_l}^{T_{l+1}} i_o(t) dt = \int_0^{T_{l+1}} i_o(t) dt - \int_0^{T_l} i_o(t) dt = C_{e,l+1} V_{l+1} = C_{d,l}(V_{l+1} - V_l)$$

The result is a formula connecting the dynamic and effective capacitances $$C_{d,l} = \frac{C_{e,l+1} V_{l+1} - C_{e,l} V_l}{V_{l+1} - V_l} \quad (4)$$

For the sequel of the invention it is assumed that gate characterization tabulates the output voltage waveforms as a function of input ramp slew and load capacitance. Further, assuming that the output waveforms are monotonous, the waveforms can be represented as a sequence of crossing times corresponding to a sequence of voltage thresholds. Note that the monotonicity assumption is problematic for RLC circuits which may exhibit more complicated behavior, e.g., ringing. This problem is not addressed in this invention.

For a given ramp slew value, the model captures the crossing times $T_i$, of voltage thresholds $V_i$, respectively, when the gate, loaded by an ideal capacitance, $C_l$, performs a full transition $$T_i(C_l) = \Theta(V_i, C_l), i=1, \ldots, m, l=1, \ldots, n \quad (5)$$

Such a model is easily pre-characterized by performing full circuit simulation on the gate loaded by various pure capacitive loads, and excited by voltage ramps of a varying slew rates. The pre-characterization results can be stored in tabular form. In general, multiple tables will be needed for various input ramp slews. This particular form of pre-characterization is denoted as MVTM.

Based on the MVTM pre-characterized gate described above, a multiple voltage threshold timing analysis algorithm according to one embodiment of the invention determines during timing analysis the waveform at the driving point of the gate loaded by an arbitrary interconnect circuit. The algorithm is restricted to monotonous output waveforms.

The input excitation slew is assumed known (determined by the analysis of the previous stage). The MVTM table of Equation (5) corresponding to this slew is first selected and/or calculated by interpolation.

The assumption that the transition at the gate driving point is monotonic is taken advantage of and used to calculate the times needed to cross a sequence of voltage thresholds. With no loss of generality, a rising transition at the driving point is analyzed. Each step of the analysis determines the time, $\Delta T_i$, for the driving point voltage to advance between successive voltage thresholds $V_l, V_{l+1}$.

For the voltage interval $[V_l, V_{l+1}]$, the following charge equilibrium condition is imposed: the integral of the current supplied by the driver must be equal to the charge that flows into the load. The subsequent analysis is based on the additional assumption of a piecewise linear representation of the output voltage, i.e., the driving point voltage changes linearly between successive break-points $V_l$ and $V_{l+1}$. The charge supplied by the driver is computed as:

$$\int_{T_l}^{T_{l+1}} i_o(t) dt = \int_{T_l}^{T_{l+1}} \frac{i_o(t)}{\dot{v}} \dot{v} dt$$
$$= \int_{T_l}^{T_{l+1}} C_d(t) \frac{V_{l+1} - V_l}{T_{l+1} - T_l} dt$$

and obtain $$\int_{T_l}^{T_{l+1}} i_o(t) dt = (V_{l+1} - V_l) C_{d,l} \quad (6)$$

where $C_{d,l}$ denotes the average dynamic capacitance exhibited by the gate between the two threshold crossings.

An analytical expression is now derived for the charge flowing into the load. The load is fully characterized by the Laplace-domain admittance, $Y(s)$. $Y(s)$ is determined from the linear interconnect circuit either directly, by model order reduction techniques, or in the form of a π-model. The most general form that this admittance may take for an RLC circuit is:

$$Y(s) = k_{-1}s + k_0 + \sum_{j=1}^{N} \frac{k_j}{1 + sd_j}$$

From it an expression is derived for the current integral as a sum of charge states $$\int_0^{T_l} i_o(t) dt = \sum_{j=-1}^{N} Q_{j,l}$$

Here $Q_{-1,l}$ corresponds to the term in s, (the directly attached capacitance), $Q_{0,l}$ corresponds to the integral of the DC current, equal to zero when the interconnect has no DC path to ground, and $Q_{1,l}, \ldots Q_{N,l}$ correspond to the $d_1, \ldots, d_N$ time constants of the interconnect circuit.

For timing analysis purposes, the state charges are conveniently expressed recursively, the state at the crossing of threshold $V_{l+1}$, as a function of the state at the crossing of threshold $V_l$.

$$Q_{-l,l+1} = Q_{-1,l} + k_{-1}(V_{l+1} - V_l) \quad (7)$$

$$Q_{0,l+1} = Q_{0,l} + \frac{1}{2}\left(\sum_{i=0}^{N} k_i\right)(V_{l+1} - V_l)(T_{l+1} - T_l)$$

$$Q_{j,l+1} = I_{j,l} + Q_{j,l} e^{-\frac{T_{l+1}-T_l}{d_j}},$$

$$j = 1, \ldots, N$$

where $$I_{j,l} = (-k_j d_j)V_l\left[1 - e^{-\frac{T_{l+1}-T_l}{d_j}}\right] +$$

$$(-k_j d_j)(V_{l+1} - V_l)\left[1 - \frac{d_j}{T_{l+1} - T_l}\left(1 - e^{-\frac{T_{l+1}-T_l}{d_j}}\right)\right]$$

The detailed derivation of Equation (7) is straightforward and is omitted for conciseness.

The charge flowing into the load is between voltage thresholds $[V_l, V_{l+1}]$ is $$\int_{T_l}^{T_{l+1}} i_o(t) dt = \sum_{j=-1}^{N} (Q_{j,l+1} - Q_{j,l})$$

and it is equated with the charge produced by the driver in Expression (6) to obtain the equation that needs to be solved for each new voltage threshold $V_{l+1}$ $$C_{d,l}(V_{l+1} - V_l) = \quad (8)$$

$$k_{-1}(V_{l+1} - V_l) + \frac{1}{2}\left(\sum_{i=0}^{N} k_i\right)(V_{l+1} - V_l)(T_{l+1} - T_l) +$$

$$\sum_{j=1}^{N}\left[I_{j,l} + Q_{j,l}\left(e^{-\frac{T_{l+1}-T_l}{d_j}} - 1\right)\right]$$

This equation needs to be solved at each voltage threshold crossing, $V_{l+1}$ assuming that a similar equation was solved at the previous crossing $V_l$. The main unknown is the crossing time $T_{l+1}$, but the dynamic capacitance is also unknown. Fortunately, an additional equation can be written from the driver model. It is assumed that between the crossing of thresholds $V_l$ and $V_{l+1}$ the driver behaves as if loaded by a capacitive load equal to $C_{d,l}$, i.e., $$T_{l+1} - T_l = \Theta(C_{d,l}, V_{l+1}) - \Theta(C_{d,l}, V_l) \quad (9)$$

The Equation (9) can be substituted in Equation 8 resulting in a single equation with a single unknown, $C_{d,l}$ that can be solved numerically with a zero finding algorithm. The new crossing time $T_{l+1}$ results trivially from Equation (9).

In the special case of a $\pi$-model interconnect with parameters $C_n$, $R_\pi$, $C_f$, $$k_{-1} = C_n$$

$$k_0 = 0,$$

$$k_1 = -\frac{1}{R_\Pi}$$

and $$d_1 = R_\Pi C_f$$

The recursive state formulas (7) become $$Q_{-1,l+1} = Q_{-1,l} + C_n(V_{l+1} - V_l) \quad (10)$$

$$Q_{0,l+1} = Q_{0,l} = 0$$

$$Q_{j,l+1} = I_{j,l} + Q_{j,l} e^{-\frac{T_{l+1}-T_l}{R_\Pi C_f}}$$

and the Equation 8 to be solved for each new threshold voltage $V_{l+1}$ becomes $$C_{d,l}(V_{l+1} - V_l) = C_n(V_{l+1} - V_l) + \quad (11)$$

$$C_f(V_{l+1} - V_l)\left[1 - \frac{R_\Pi C_f}{T_{l+1} - T_l}\left(1 - e^{-\frac{T_{l+1}-T_l}{R_\Pi C_f}}\right)\right] +$$

$$C_f V_l\left[1 - e^{-\frac{T_{l+1}-T_l}{R_\Pi C_f}}\right] + Q_{1,l}\left(e^{-\frac{T_{l+1}-T_l}{R_\Pi C_f}} - 1\right)$$

The above analysis can be summarized by the following algorithm which will produce the crossing times for the voltage thresholds present in the MVTMs.
1. Set initial charge states $Q_{-1} = Q_0 = Q_1 = \ldots, Q_N = 0$
2. Repeat for $l = 1, \ldots, M$
   (a) Solve Equation 8 using, e.g., a Brent type zero-finding algorithm $$C_{d,l}(V_{l+1} - V_l) = k_{-1}(V_{l+1} - V_l) +$$

$$\frac{1}{2}\left(\sum_{i=0}^{N} k_i\right)(V_{l+1} - V_l)(T_{l+1} - T_l) + \sum_{j=1}^{N}\left[I_{j,l} + Q_{j,l}\left(e^{-\frac{T_{l+1}-T_l}{d_j}} - 1\right)\right]$$

after substituting $$T_{l+1} - T_l = \Theta(C_{d,l}, V_{l+1}) - \Theta(C_{d,l}, V_l)$$

The substitution leaves $C_{d,l}$ as the only unknown in the equation.
Upon convergence, its value is determined.
(b) The desired crossing time is trivially recovered as $$T_{l+1} - T_l = \Theta(C_{d,l}, V_{l+1}) - \Theta(C_{d,l}, V_l)$$

(c) Finally, the interconnect charge states are updated:

$$Q_{-l,l+1} = Q_{-1,l} + k_{-1}(V_{l+1} - V_l)$$

$$Q_{0,l+1} = Q_{0,l} + \frac{1}{2}\left(\sum_{i=0}^{N} k_i\right)(V_{l+1} - V_l)(T_{l+1} - T_l)$$

$$Q_{j,l+1} = I_{j,l} + Q_{j,l} e^{-\frac{T_{l+1}-T_l}{d_j}},$$

$j = 1, \ldots, N$ and the next threshold value is advanced to.

This algorithm avoids the time-domain integration that would be necessary for a straightforward controlled current source model. In that case, the nonlinear equation of the model $i = f_{vc}(v,c)$ needs to be added to the time-domain differential equations of the linear interconnect, in full or reduced form and solved by various well-known techniques. This approach requires a smooth representation of the model, time-step control, etc. In contrast the algorithm of this invention uses the raw characterization data directly, avoiding the errors introduced by the current-source modeling. The size and the number of steps are dictated solely by the accuracy of the model and not by the stiffness of the equation.

Figure 1:
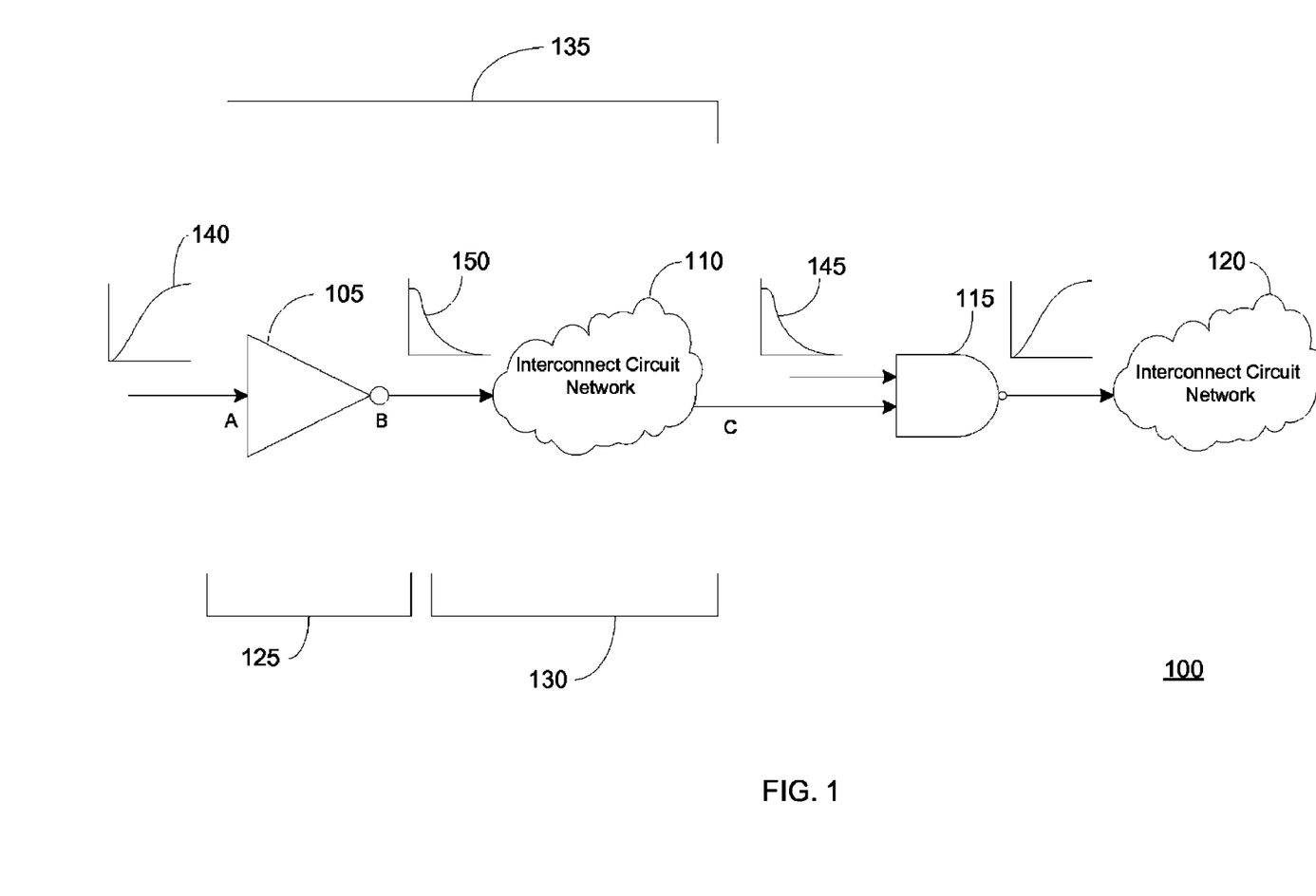
FIG. 1 shows an example of a digital integrated circuit.

FIG. 1 shows an example of a digital integrated circuit 100 in which the multiple voltage threshold timing analysis algorithm of the invention can be used to analyze. The digital integrated circuit 100 of FIG. 1 includes a CMOS inverter 105 having an input pin A and an output pin B. Interconnect circuit network 110 receives output pin B of the CMOS inverter 105 and generates its output through output pin C. Output pin C is fed into one of the inputs of a NAND2 gate 115 which feeds its output to an interconnect circuit 120.

A typical static timing analysis (STA) tool such as the one embodied in this invention breaks the analysis into two parts: 1) gate timing analysis 125, (i.e., gate propagation delay and output slew calculation) and 2) interconnect circuit timing analysis 130 (i.e., interconnect propagation delay and output slew calculation). The overall delay from input pin A of the CMOS inverter 105 to the input pin C of the NAND2 gate 115 is written as the sum of the gate delay from input pin A to the output pin B of CMOS inverter 105 and interconnect propagation delay from output pin B of the inverter 105 to the input pin C of the NAND2 gate 115 as set forth in equation 12.

$$\text{Delay}_{AC} = \text{Delay}_{AB} + \text{Delay}_{BC} \qquad (12)$$

Therefore, the stage delay 135 is defined as the delay from the voltage from 140 at the input pin of a CMOS gate 105 to the voltage waveform 145 at the input pin of each gate 115 in the fan-out of the primitive gate 105.

For the interconnect circuit timing analysis, the voltage waveform 145 at the sink terminals of the interconnect network 110 is a function of the voltage waveform 150 at the input terminal of the interconnect network 110 (i.e., the voltage waveform 150 at the output pin of the gate 105 connected to the interconnect network), the interconnect parasitics and the input capacitance of each gate 115 at the output terminal of the interconnect network 110. The interconnect impulse response is a function of the interconnect parasitics, (i.e. the resistances, capacitances, and inductances of the interconnect 110) as well as the input pin capacitance of all gates 115 connected to the sink terminals of the interconnect network. The interconnect delay and output slew is calculated by fitting a ramp or a piece-wise-linear waveform to the voltage waveform 150 at the input terminal of the interconnect network and convolving it with the impulse response transfer function of the interconnect.

Various Model Order Reduction (MOR) techniques such as Asysmptotic Waveform Evaluation (AWE), Passive Reduced-order Interconnect Macromodeling Algorithm (PRIMA), etc., have been proposed for accurate interconnect timing analysis. These MOR techniques reduce the complexity of the large-scale interconnect networks to smaller ones while preserving (to the possible extent) their input-output behavior. In other words, the large-scale interconnect networks are reduced to a smaller interconnect network, such that when the same input signal is applied to both, the original interconnect network and the reduced order model one, their output response will closely match each other. Note that higher order reduced models will have more similar behavior with the original interconnect network while it will add more complexity to the analysis. For instance, a first reduced order model can be very fast to be analyzed, while it might destroy the input-output behavior of the system. Therefore, there will be a trade-off between accuracy and speed for determining the order of the reduced model.

For the gate timing analysis, gate output voltage waveform 150 is a function of different parameters, including the voltage waveform 140 at the input terminal of the gate (which is propagated from the previous stages of the design), the output load parasitics, (i.e. the resistance, capacitance, and inductance of the load 110 as well as the input pin capacitance of each gate 115 in the fan-out of the primitive gate 105), and the primitive gate 105 timing characteristics. Therefore, given the input voltage waveform 140 the gate timing library, the load parasitics 110 and the input pin capacitance of the gates in the fan-out of the primitive gate 105; the gate timing analysis calculates the gate output voltage waveform 150 characteristics with respect to the gate input voltage waveform 140 characteristics, (e.g., the gate propagation delay and output slew).

Different gate/driver modeling techniques exist for gate timing analysis. Three well-known ones are based on (1) the use of delay and slew polynomial equations which is characterized as a function of input slew, output capacitive load, manufacturing process parameters (e.g. NP-skew, doping concentration), and the environmental parameters (e.g. Vdd, Temp); (2) the use of delay and slew tables which are characterized as a function of input slew and output capacitive load, manufacturing process parameters (e.g. NP-skew, doping concentration), and the environmental parameters (e.g. Vdd, Temp); and (3) the use of industry standard current source models, ECSM (CCS), where the output voltage (current) waveforms are characterized and tabulated as a function of input slew and output capacitive load, manufacturing process parameters (e.g. NP-skew, doping concentration), and the environmental parameters (e.g. Vdd, Temp).

Figure 2:
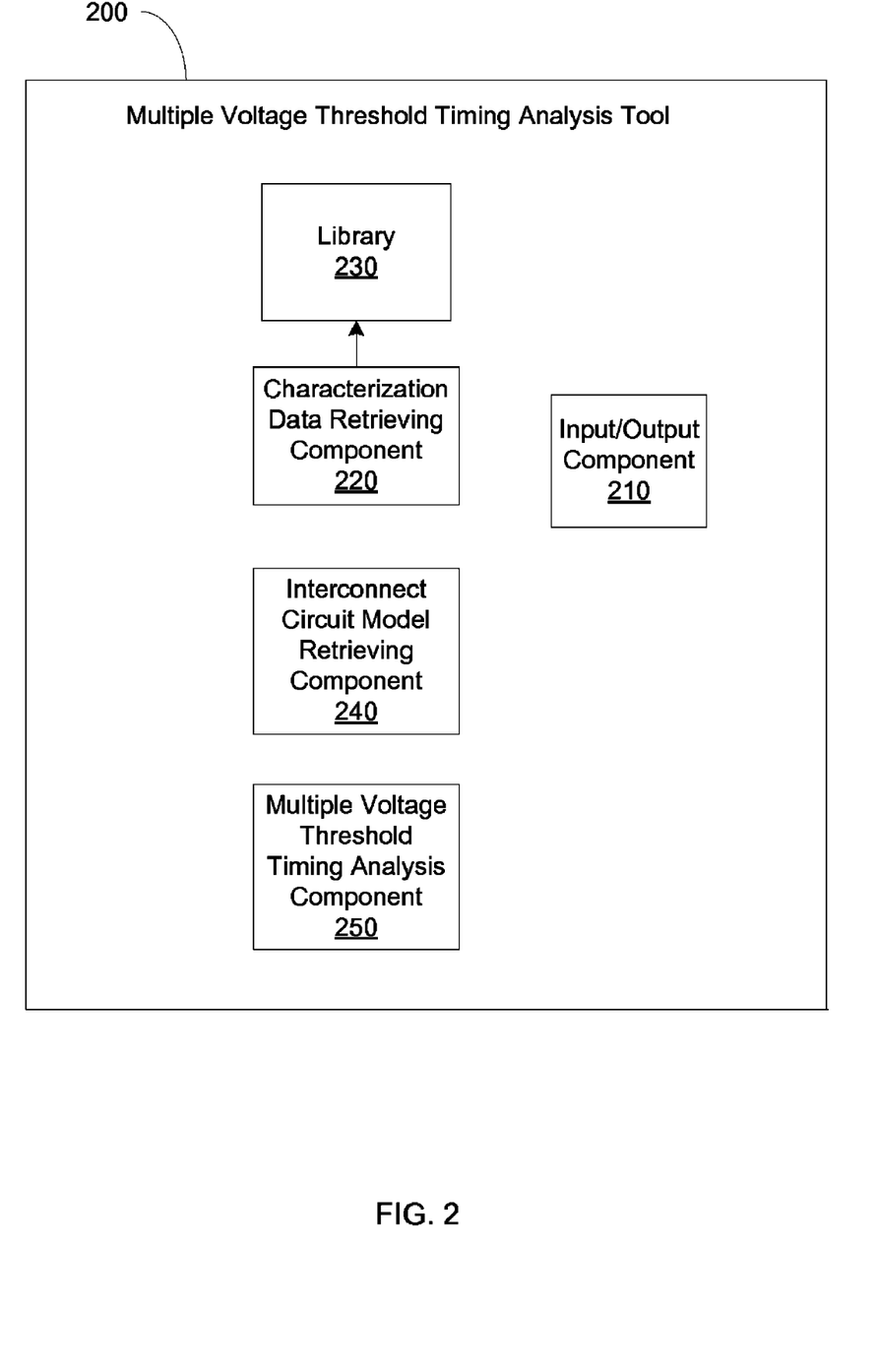
FIG. 2 shows a schematic block diagram of a multiple voltage threshold timing analysis tool according to one embodiment of the invention.

FIG. 2 shows a schematic block diagram of a multiple voltage threshold timing analysis tool 200 according to one embodiment of the invention. The multiple voltage threshold timing analysis tool 200 comprises an input/output component 210 configured to receive input and output. In particular, the input/output component 210 is configured to receive information on digital integrated circuits (e.g., logic gates, arcs of logic gates which are individual input/output pairs that form the gates and interconnect circuits) that will undergo the aforementioned multiple voltage threshold timing analysis. A non-exhaustive listing of information that the input/output component 210 may receive that relates to the digital integrated circuits include the type of components in the circuits and their relationships with respect to each other, dimensions of the components, geometries of the components on the circuit, models representing the components, etc. The input/output component 210 is configured to output results from the multiple voltage threshold timing analysis in the form of time-domain waveforms. Standard timing analysis extracts slew, delay, and effective capacitance information from these waveforms. Those skilled in the art will recognize that this listing is only illustrative of the way the waveforms can be used. For example, the waveform itself can be used to drive the fanout circuits, resulting in more accurate timing analysis.

A characterization data retrieving component 220 is configured to obtain characterization data of at least one logic gate in the digital integrated circuit from a library 230. The characterization data describes the driving behavior of the logic gates and in particular, the data tabulates a driving point voltage waveform for each of the logic gates as a function of slew of an input voltage ramp signal and load capacitance. In one embodiment, this characterization data is pre-characterized and stored in look-up tables within the library 230. The characterization data stored in the look-up tables of the library 230 is typically obtained from models that provide data that is formatted in a standard such as ECSM and CCS.

An interconnect circuit model retrieving component 240 is configured to obtain a model of an interconnect circuit in the digital integrated circuit that loads the logic gate. In one embodiment, the interconnect circuit model retrieving component obtains a reduced ordered model of the interconnect circuit. Before the interconnect circuit model retrieving component 240 can obtain a model of an interconnect circuit, an extraction program, which is well-known in the art, will go over the entire digital integrated circuit and model the geometries of the chip with resistances, capacitances, inductances, etc., and generate a model representing the load of the interconnect circuit. Then the interconnect model obtained from the extraction program is analyzed and reduced to any one of a well-known reduced model form. One reduced model form is the aforementioned π-model. Any one of a variety of well-known reduction algorithms can be used to reduce the extracted interconnect model to a reduced ordered model. In one embodiment of the invention, it is preferable to represent the reduced ordered model in a pole/residue form; however, other equivalent forms are suitable for use.

FIG. 2 shows that the multiple voltage threshold timing analysis tool 200 further comprises a multiple voltage threshold timing analysis component 250 configured to run the aforementioned multiple voltage threshold timing analysis algorithm. In particular, the algorithm used by the multiple voltage threshold timing analysis component 250 uses the characterization data for the logic gate that has been retrieved by the characterization data retrieving component 220 and the reduced ordered model of the interconnect circuit that has been retrieved by the interconnect circuit model retrieving component 240 to determine the waveform produced by the logic gate to the interconnect circuit.

The algorithm run by the multiple voltage threshold timing analysis component 250 determines the waveform output by the logic gate in terms of the crossing times of all of the various voltage thresholds. Note that all of the various voltage thresholds make it possible to ascertain the shape of the waveform at the output of the logic gate. In one embodiment, the algorithm starts from the zero state and proceeds to the first voltage threshold and calculates the time to cross (crossing time) the first threshold. As mentioned above, the algorithm estimates a charge supplied by the logic gate to the interconnect circuit at this voltage threshold, determines a dynamic capacitance from the estimated charge and determines the crossing time as function of the dynamic capacitance and voltage threshold. The algorithm performs similar calculations for each of the voltage thresholds in the sequence. In one embodiment, the voltage thresholds can sequence from 0 to 10% to 20% all the way to 100%. Those skilled in the art will recognize that any sequence of voltage thresholds (e.g., 5%, 10%, 15%, etc.) can be used to derive the crossing times. The interval for sequencing from voltage threshold to voltage threshold will depend on the desired accuracy.

By determining the time that it takes to move in sequence from one voltage threshold to the next threshold to the next, the algorithm is able to use these crossing times and their corresponding voltage thresholds to piece together the voltage waveform outputted by the logic gate. In particular, each crossing time and corresponding voltage threshold represents a voltage-time pair which if plotted on a voltage-time axis will result in the output voltage waveform.

With the resultant output voltage waveform, the multiple voltage threshold timing analysis component 250 is able to perform a variety of other timing analyses. In particular, because the voltage waveform is indicative of how the digital integrated circuit will react, it can be used to determine items such as the timing (delay and slew) of the logic gate and the interconnect circuit and the $C_{effective}$ charge necessary to cross the 50% voltage threshold. In addition, the multiple voltage threshold timing analysis component 250 can use the waveform to determine the timing of the entire path, i.e., check if the path is fast enough to propagate before the clock is loaded.

Note that the analysis performed by the multiple voltage threshold timing analysis algorithm uses T(V,C) information as presented by the ECSM data format. However those skilled in the art will recognize that the T(V,C) data could be translated from current waveforms such as those specified by the CCS data format.

Although not expressly shown in FIG. 2, all of the components shown in the figure are configured to interact with each other. The components that are shown as being interconnected are illustrated in that manner to convey the close interactions that exist between these components such as the characterization data retrieving component 220 and the library 230.

Figure 3:
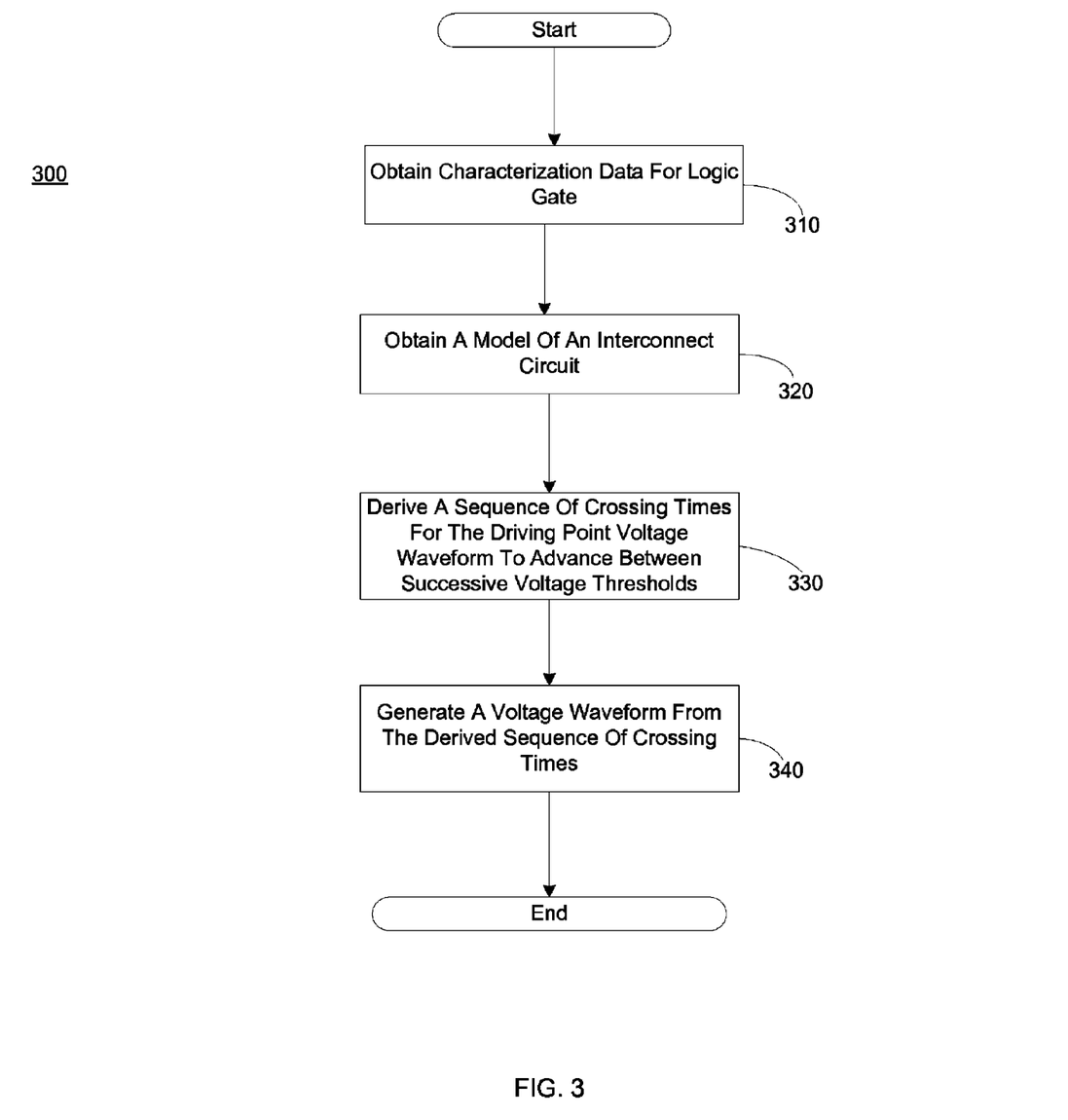
FIG. 3 shows a flow diagram describing the multiple voltage threshold timing analysis according to one embodiment of the invention.

FIG. 3 shows a flow diagram 300 describing the multiple voltage threshold timing analysis of a digital integrated circuit having at least one logic gate loaded by an interconnect circuit according to one embodiment of the invention. The multiple voltage timing analysis begins at 310 where the characterization data retrieving component 220 obtains characterization data of a least one logic gate from the library 230. The characterization data describes the driving behavior of the logic gate and in particular data tabulates a driving point voltage waveform of the logic gate as a function of slew of an input voltage ramp signal and load capacitance. The interconnect circuit model retrieving component 240 obtains a model of the interconnect circuit (e.g. a reduced ordered model) at 320. The model is typically generated prior to performing the multiple voltage threshold timing analysis, using an extraction program to model the load of the interconnect circuit and a reduction program to reduce the model to a reduced order model that can take a pole/residue form. Those skilled in the art will recognize that other model forms are within the scope of this invention such as the π model.

The multiple voltage threshold timing analysis component 250 runs the multiple voltage threshold timing analysis algorithm to determine the waveform produced by the logic gate to the interconnect circuit. This entails using the characterization data for the logic gate and the model of the interconnect circuit to derive at 330 a sequence of crossing times for the driving point voltage waveform to advance between successive voltage thresholds. By determining the time that it takes to move in sequence from one voltage threshold to the next threshold to the next, the algorithm is able to use these crossing times and their corresponding voltage thresholds to piece together the voltage waveform outputted by the logic gate at 340. As mentioned above, the multiple voltage threshold timing analysis component 250 can then use the resultant output voltage waveform to perform a variety of timing analyses (e.g., to determine timing of the logic gate and the interconnect circuit, the $C_{effective}$ charge necessary to cross the 50% voltage threshold, and the timing of the entire path).

The foregoing flow chart shows some of the processing functions associated with performing multiple voltage threshold timing analysis of a digital integrated circuit. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

Figure 4:
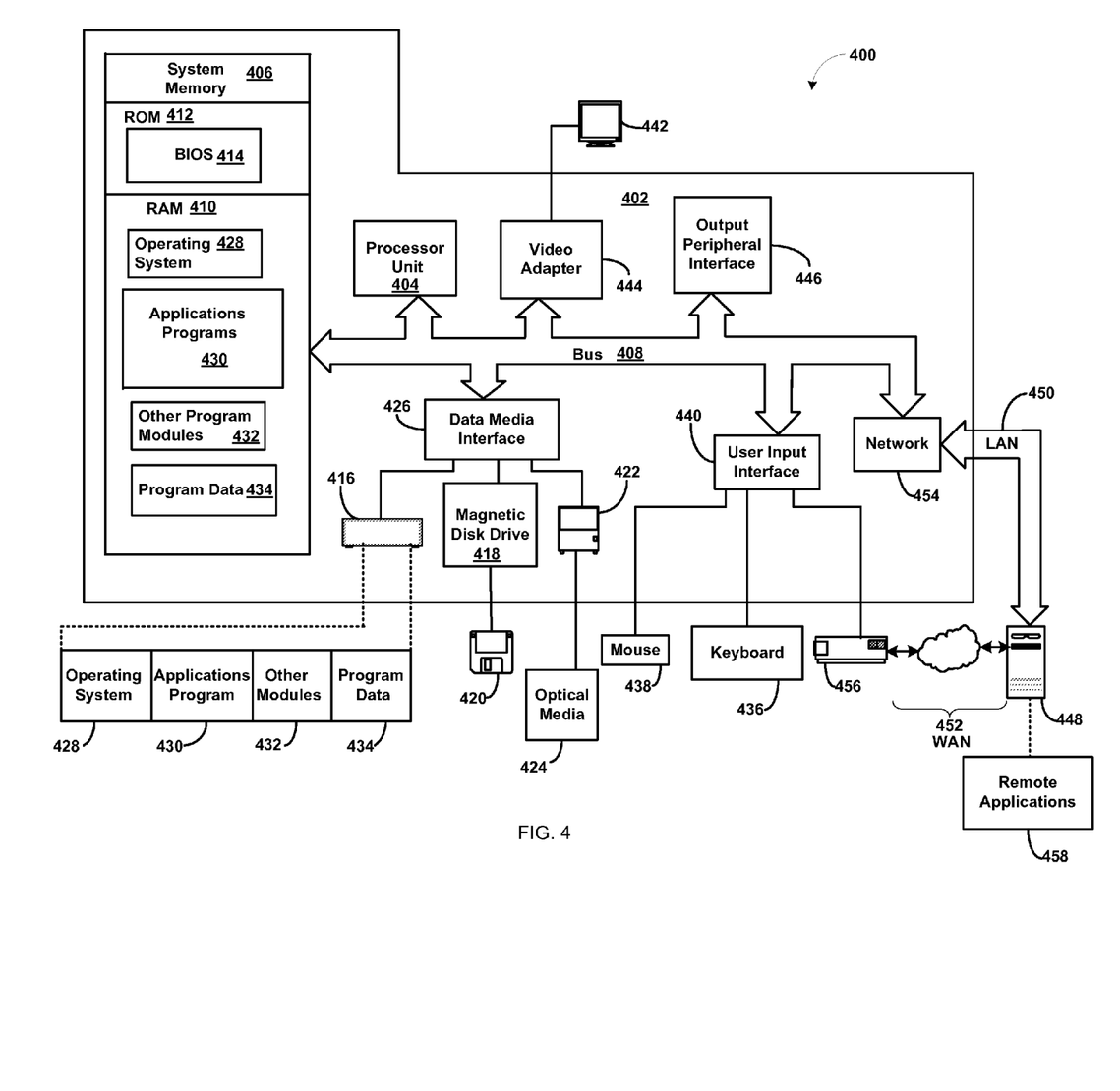
FIG. 4 shows a schematic of an exemplary computing environment in which elements of the multiple voltage threshold timing analysis tool of this invention may operate.

FIG. 4 shows a schematic of an exemplary computing environment in which elements of the multiple voltage threshold timing analysis tool 200 of this invention may operate. The exemplary computing environment 400 is only one example of a suitable computing environment and is not intended to suggest any limitation as to the scope of use or functionality of the approach described herein. Neither should the computing environment 400 be interpreted as having any dependency or requirement relating to any one or combination of components illustrated in FIG. 4.

In the computing environment 400 there is a computer 402 which is operational with numerous other general purpose or special purpose computing system environments or configurations. Examples of well known computing systems, environments, and/or configurations that may be suitable for use with an exemplary computer 402 include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The exemplary computer 402 may be described in the general context of computer-executable instructions, such as program modules, being executed by a computer. Generally, program modules include routines, programs, objects, components, logic, data structures, and so on, that performs particular tasks or implements particular abstract data types. The exemplary computer 402 may be practiced in distributed computing environments where tasks are performed by remote processing devices that are linked through a communications network. In a distributed computing environment, program modules may be located in both local and remote computer storage media including memory storage devices.

As shown in FIG. 4, the computer 402 in the computing environment 400 is shown in the form of a general-purpose computing device. The components of computer 402 may include, but are not limited to, one or more processors or processing units 404, a system memory 406, and a bus 408 that couples various system components including the system memory 406 to the processor 404.

Bus 408 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer 402 typically includes a variety of computer readable media. Such media may be any available media that is accessible by computer 402, and it includes both volatile and non-volatile media, removable and non-removable media.

In FIG. 4, the system memory 406 includes computer readable media in the form of volatile memory, such as random access memory (RAM) 410, and/or non-volatile memory, such as ROM 412. A BIOS 414 containing the basic routines that help to transfer information between elements within computer 402, such as during start-up, is stored in ROM 412. RAM 410 typically contains data and/or program modules that are immediately accessible to and/or presently operated on by processor 404.

Computer 402 may further include other removable/non-removable, volatile/non-volatile computer storage media. By way of example only, FIG. 4 illustrates a hard disk drive 416 for reading from and writing to a non-removable, non-volatile magnetic media (not shown and typically called a "hard drive"), a magnetic disk drive 418 for reading from and writing to a removable, non-volatile magnetic disk 420 (e.g., a "floppy disk"), and an optical disk drive 422 for reading from or writing to a removable, non-volatile optical disk 424 such as a CD-ROM, DVD-ROM or other optical media. The hard disk drive 416, magnetic disk drive 418, and optical disk drive 422 are each connected to bus 408 by one or more data media interfaces 426.

The drives and their associated computer-readable media provide nonvolatile storage of computer readable instructions, data structures, program modules, and other data for computer 402. Although the exemplary environment described herein employs a hard disk 416, a removable magnetic disk 418 and a removable optical disk 422, it should be appreciated by those skilled in the art that other types of computer readable media which can store data that is accessible by a computer, such as magnetic cassettes, flash memory cards, digital video disks, RAMs, ROM, and the like, may also be used in the exemplary operating environment.

A number of program modules may be stored on the hard disk 416, magnetic disk 420, optical disk 422, ROM 412, or RAM 410, including, by way of example, and not limitation, an operating system 428, one or more application programs 430, other program modules 432, and program data 434. Each of the operating system 428, one or more application programs 430 other program modules 432, and program data 434 or some combination thereof, may include an implementation of the multiple voltage threshold timing analysis tool 200 shown in FIG. 2.

A user may enter commands and information into computer 402 through optional input devices such as a keyboard 436 and a pointing device 438 (such as a "mouse"). Other input devices (not shown) may include a microphone, joystick, game pad, satellite dish, serial port, scanner, camera, or the like. These and other input devices are connected to the processor unit 404 through a user input interface 440 that is coupled to bus 408, but may be connected by other interface and bus structures, such as a parallel port, game port, or a universal serial bus (USB).

An optional monitor 442 or other type of display device is also connected to bus 408 via an interface, such as a video adapter 444. In addition to the monitor, personal computers typically include other peripheral output devices (not shown), such as speakers and printers, which may be connected through output peripheral interface 446.

Computer 402 may operate in a networked environment using logical connections to one or more remote computers, such as a remote server/computer 448. Remote computer 448 may include many or all of the elements and features described herein relative to computer 402.

Logical connections shown in FIG. 4 are a local area network (LAN) 450 and a general wide area network (WAN) 452. Such networking environments are commonplace in offices, enterprise-wide computer networks, intranets, and the Internet. When used in a LAN networking environment, the computer 402 is connected to LAN 450 via network interface or adapter 454. When used in a WAN networking environment, the computer typically includes a modem 456 or other means for establishing communications over the WAN 452. The modem, which may be internal or external, may be connected to the system bus 408 via the user input interface 440 or other appropriate mechanism.

In a networked environment, program modules depicted relative to the personal computer 402, or portions thereof, may be stored in a remote memory storage device. By way of example, and not limitation, FIG. 4 illustrates remote application programs 458 as residing on a memory device of remote computer 448. It will be appreciated that the network connections shown and described are exemplary and other means of establishing a communications link between the computers may be used.

An implementation of an exemplary computer 402 may be stored on or transmitted across some form of computer readable media. Computer readable media can be any available media that can be accessed by a computer. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media.

The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

It is apparent that there has been provided by this invention an approach for performing multiple voltage threshold timing analysis for a digital integrated circuit. While the invention has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method, performed on a computer system, for performing a multiple voltage threshold timing analysis of a digital integrated circuit having at least one logic gate loaded by an interconnect circuit, the method comprising:
   using the computer system to perform the following:
   obtaining characterization data describing driving behavior of the at least one logic gate, wherein the characterization data is obtained from a circuit-level model of the at least one logic gate and is in a form that approximates a current source, wherein the characterization data tabulates a driving point voltage waveform for the at least one logic gate as a function of slew of an input voltage ramp signal and load capacitance;
   obtaining a model of the interconnect circuit;
   deriving a sequence of crossing times for the driving point voltage waveform to advance between successive voltage thresholds from the characterization data of the at least one logic gate and the model of the interconnect circuit, wherein the deriving of a sequence of crossing times comprises estimating a charge supplied by the at least one logic gate to the interconnect circuit on a piecewise basis at each of the successive voltage thresholds provided in the driving point voltage waveform and determining a dynamic capacitance on a piecewise basis at each of the successive voltage thresholds from the estimated charges, wherein each crossing time is derived as a function of each determined dynamic capacitance and corresponding sequence of voltage thresholds; and
   generating a voltage waveform by piecing together the derived sequence of crossing times and the corresponding sequence of voltage thresholds, wherein the generated voltage waveform is a piecewise linear waveform indicative of the driving point voltage of the at least one logic gate loaded by the interconnect circuit.

2. The method according to claim 1, wherein the obtaining of characterization data comprises accessing a library containing a plurality of tables representing the at least one logic gate loaded by various pure capacitive loads and excited by voltage waveforms of varying slew rates.

3. The method according to claim 1, wherein the obtaining of the model of the interconnect circuit comprises obtaining a reduced ordered model that is represented in a pole/residue form.

4. The method according to claim 1, further comprising using the generated voltage waveform to perform a timing analysis of the digital integrated circuit.

5. The method according to claim 4, further comprising determining the timing of an entire path of the digital integrated circuit.

6. A computer-readable storage device storing computer instructions, which when executed, enables a computer system to perform a multiple voltage threshold timing analysis of a digital integrated circuit having at least one logic gate loaded by an interconnect circuit, the computer instructions comprising:
   obtaining characterization data describing driving behavior of the at least one logic gate, wherein the characterization data is obtained from a circuit-level model of the at least one logic gate and is in a form that approximates a current source, wherein the characterization data tabulates a driving point voltage waveform for the at least one logic gate as a function of slew of an input voltage ramp signal and load capacitance;
   obtaining a model of the interconnect circuit;
   deriving a sequence of crossing times for the driving point voltage waveform to advance between successive voltage thresholds from the characterization data of the at least one logic gate and the model of the interconnect circuit, wherein the deriving of a sequence of crossing times comprises estimating a charge supplied by the at least one logic gate to the interconnect circuit on a piecewise basis at each of the successive voltage thresholds provided in the driving point voltage waveform, and determining a dynamic capacitance on a piecewise basis at each of the successive voltage thresholds from the estimated charges, wherein each crossing time is derived as a function of each determined dynamic capacitance and corresponding sequence of voltage thresholds; and generating a voltage waveform by piecing together the derived sequence of crossing times and the corresponding sequence of voltage thresholds, wherein the generated voltage waveform is a piecewise linear waveform indicative of the driving point voltage of the at least one logic gate loaded by the interconnect circuit.

7. The computer-readable storage device according to claim 6, wherein the obtaining of characterization data comprises instructions for accessing a library containing a plurality of tables representing the at least one logic gate loaded by various pure capacitive loads and excited by voltage waveforms of varying slew rates.

8. The computer-readable storage device according to claim 6, wherein the obtaining of the model of the interconnect circuit comprises instructions for obtaining a reduced ordered model of the interconnect that is represented in a pole/residue form.

9. The computer-readable storage device according to claim 6, further comprising instructions for using the generated voltage waveform to perform a timing analysis of the digital integrated circuit.

10. The computer-readable storage device according to claim 9, further comprising instructions for determining the timing of an entire path of the digital integrated circuit.

11. A computer system for performing a multiple voltage threshold timing analysis, comprising:
at least one processing unit;
memory operably associated with the at least one processing unit; and
a multiple voltage threshold timing analysis tool storable in memory and executable by the at least one processing unit for performing a multiple voltage threshold timing analysis of a digital integrated circuit having at least one logic gate loaded by an interconnect circuit, the tool comprising:
a characterization data retrieving component configured to obtain characterization data describing driving behavior of the at least one logic gate, wherein the characterization data is obtained from a circuit-level model of the at least one logic gate and is in a form that approximates a current source, wherein the characterization data tabulates a driving point voltage waveform for the at least one logic gate as a function of slew of an input voltage ramp signal and load capacitance;
an interconnect circuit model retrieving component configured to obtain a model of the interconnect circuit; and
a multiple voltage threshold timing analysis component configured to derive a sequence of crossing times for the driving point voltage waveform to advance between successive voltage thresholds from the characterization data of the at least one logic gate and the model of the interconnect circuit, wherein the deriving of a sequence of crossing times comprises estimating a charge supplied by the at least one logic gate to the interconnect circuit on a piecewise basis at each of the successive voltage thresholds provided in the driving point voltage waveform, and determining a dynamic capacitance on a piecewise basis at each of the successive voltage thresholds from the estimated charges, wherein each crossing time is derived as a function of each determined dynamic capacitance and corresponding sequence of voltage thresholds, and generate a voltage waveform by piecing together the derived sequence of crossing times and the corresponding sequence of voltage thresholds, wherein the generated voltage waveform is a piecewise linear waveform indicative of the driving point voltage of the at least one logic gate loaded by the interconnect circuit.

12. The system according to claim 11, wherein the characterization data retrieving component is configured to obtain the characterization data from a library containing a plurality of tables representing the at least one logic gate loaded by various pure capacitive loads and excited by voltage waveforms of varying slew rates.

13. The system according to claim 11, wherein the interconnect circuit model retrieving component is configured to obtain a reduced ordered model of the interconnect that is in a pole/residue form.

14. The system according to claim 11, wherein the multiple voltage threshold timing analysis component is further configured to use the generated voltage waveform to perform a timing analysis of the digital integrated circuit.

15. The system according to claim 14, wherein the multiple voltage threshold timing analysis component is further configured to determine the timing of an entire path within the digital integrated circuit.

* * * * *